United States Patent [19]

Ovens et al.

[11] Patent Number: 5,045,724
[45] Date of Patent: Sep. 3, 1991

[54] CIRCUIT FOR LIMITING THE SHORT CIRCUIT OUTPUT CURRENT

[75] Inventors: Kevin M. Ovens, Garland; Jeffrey A. Niehaus, Dallas; Bob D. Strong, Sachse, all of Tex.

[73] Assignee: Texas Instruments Corporation, Dallas, Tex.

[21] Appl. No.: 423,085

[22] Filed: Oct. 18, 1989

[51] Int. Cl.$^5$ ................. H03K 19/088; H03K 19/013
[52] U.S. Cl. ..................................... 307/456; 307/458; 307/443; 307/544
[58] Field of Search ............... 307/443, 456, 457, 458, 307/475, 270, 542, 544

[56] References Cited

U.S. PATENT DOCUMENTS 4,623,803 11/1986 Thompson et al. ............ 307/456 X
4,839,538 6/1989 Curtis ............................ 307/443 X
4,890,015 12/1989 Wise ............................. 307/544 X Primary Examiner—Stanley D. Miller
Assistant Examiner—David R. Bertelson
Attorney, Agent, or Firm—Gary C. Honeycutt; Melvin Sharp; N. Rhys Merrett

[57] ABSTRACT

A TTL gate (22) includes a current generating circuit (24) comprising an NPN transistor (30) having its base coupled to a diode (24) and its emitter coupled to one of the gate's output transistors (14). Transistor (30) enables diode (24) to deliver a high current of short duration to the output OUT responsive to a low-to-high output transition. The current provides low-to-high output transition while protecting output transistor (14) from damaging currents caused by a short circuit at output OUT.

6 Claims, 1 Drawing Sheet

CIRCUIT FOR LIMITING THE SHORT CIRCUIT OUTPUT CURRENT

TECHNICAL FIELD OF THE INVENTION

This invention relates in general to integrated circuits, and more particularly to a circuit which provides a fast output transition while limiting the short circuit output current.

BACKGROUND OF THE INVENTION

In integrated circuit design, great emphasis is placed on the operating speed of the circuit. For transistor-transistor logic (TTL) gates with totem-pole outputs, this implies a high operating current. However, during testing procedures, the output of a circuit may be shorted to ground. If the short circuited output current (IOS) is too large for too long, parts of the integrated circuit device will be damaged.

In its simplest form, a TTL gate with a totem-pole output comprises an input transistor (also known as a phase splitter), two output transistors (referred to here as upper and lower output transistors), and a current limiting resistor. The base of the phase splitter is coupled to the TTL gate input, its emitter is coupled to the base of the lower output transistor and its collector is coupled to the base of the upper output transistor. The collector of the lower output transistor and the emitter of the upper output transistor are coupled together and form the output of the gate. The emitter of the lower output transistor is coupled to ground and the collector of the upper output transistor is coupled to a voltage source through the resistor. In addition, the load to which the gate output is coupled has a certain capacitance.

In operation, the phase splitter acts as a common collector to the upper output transistor, turning it on when the input is low, and acts as an emitter follower to the lower output transistor, turning it on when the input is high. The capacitance at the gate output must be charged and discharged for gate switching to take place. The upper output transistor acts as a current source to charge the capacitance while the lower output transistor acts as a current sink to discharge the capacitance. If the capacitance can be made to charge more rapidly, the overall speed of the gate can be increased.

One method used in the prior art to more rapidly charge the capacitance has been to lower the value of the resistor coupled to the collector of the upper output transistor. This permits a higher current to flow through the upper output transistor into the output. A crucial disadvantage of this method is that the output current may be excessive in the event that the output is shorted to ground; the upper output transistor can be destroyed as a result, since shorting the output to ground is a common test given after a circuit has been constructed.

Therefore, a need has arisen to provide a circuit for providing a fast output low-to-high transition while maintaining the short circuited output current at a safe level.

SUMMARY OF THE INVENTION

In accordance with the present invention, a high-speed output circuit responsive to a low-to-high output transition is provided which substantially increases the operating speed of a logic gate while maintaining the short circuited output current at a safe level.

In the present invention, a circuit is provided which produces an impulse-like current of limited duration to the upper output transistor of a TTL gate. The circuit includes a capacitive element operable to store a charge and switching circuitry operable to discharge the capacitive element when the output is in transition from low to high. Upon transition from a low to a high logic state, the switching circuitry allows the capacitive element to discharge a current into the upper output transistor.

Hence, the circuit of the present invention provides the technical advantage of a fast operating speed for the low-to-high output transition while protecting the upper output transistor from damaging currents caused by a short-circuit at the output. In the event the output is short-circuited to ground, such as during testing, the circuit is protected because the current from the invention is of very short duration.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION OF THE INVENTION

Figure 1:
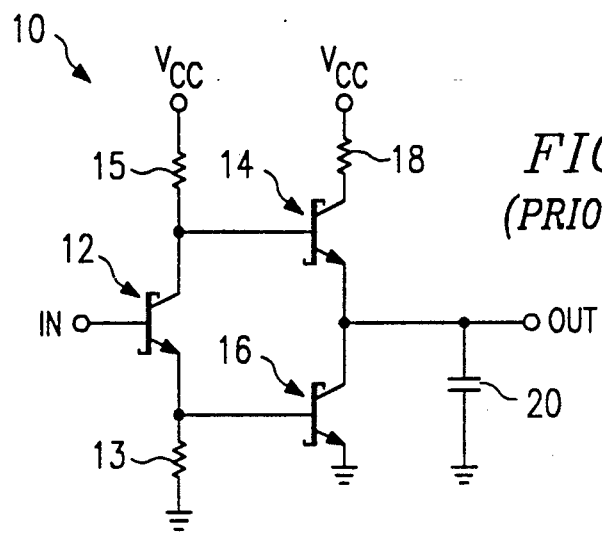
FIG. 1 illustrates a schematic representation of a simplified prior art TTL circuit with a totem-pole output.
Figure 2:
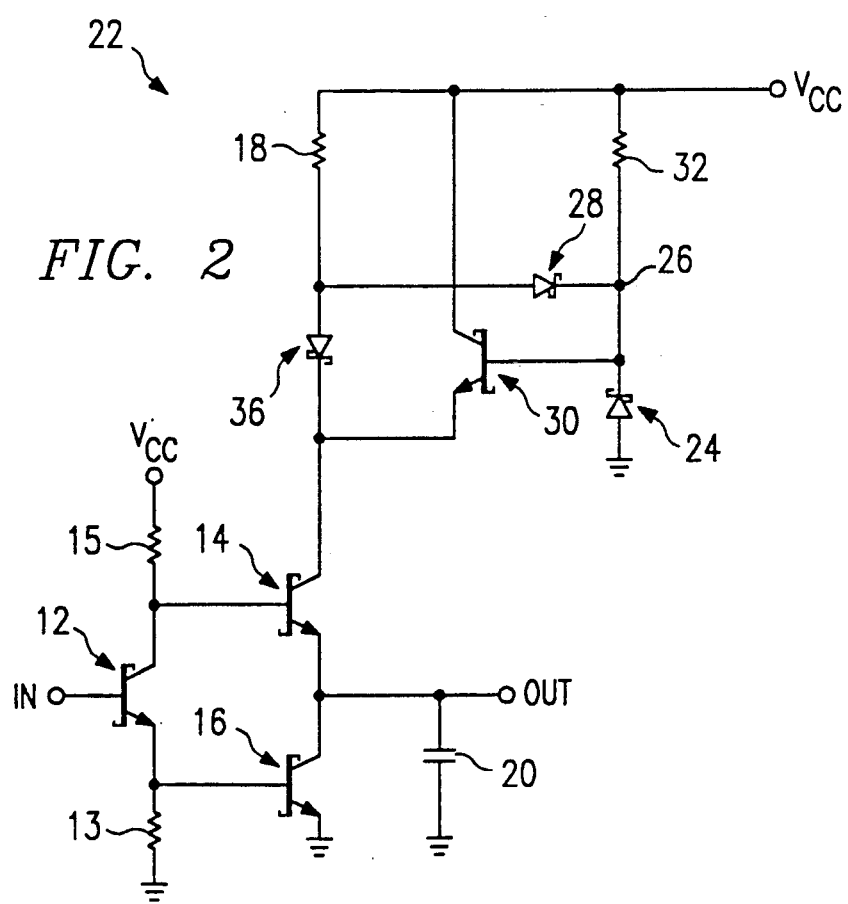
FIG. 2 illustrates a schematic representation of a simplified TTL circuit using the output transition circuit of the present invention.

The preferred embodiment of the present invention is best understood by referring to FIGS. 1-2 of the drawings, like numerals being used for like and corresponding parts of the various drawings.

FIG. 1 illustrates a schematic representation of a prior art TTL gate, generally referred to by reference numeral 10. The TTL gate illustrated in FIG. 1 receives an input signal IN from a previous logic gate and produces an output signal OUT which is inverted from the input IN. It is understood that more complex logic gates can be formed using TTL technology, and that the TTL gate 10 illustrated in FIG. 1 is only one example thereof.

The TTL gate 10 comprises an input NPN transistor 12 and two output NPN transistors 14 and 16 and resistors 13 and 15. The IN signal is connected to the base of input transistor 12, also known as a phase splitter. The collector of input transistor 12 is connected to the base of one output transistor 14 (the upper output transistor), and the emitter of input transistor 14 is connected to the base of the other output transistor 16 (the lower output transistor). Resistor 13 is connected between the emitter of transistor 12 and ground. Resistor 15 is connected between the collector of transistor 12 and $V_{cc}$. The collector of lower output transistor 16 is connected to the emitter of upper output transistor 14, this connection also serving as the output node (the OUT node). The emitter of lower output transistor 16 is coupled to ground and the collector of upper output transistor 14 is coupled to a voltage source $V_{cc}$ through a resistor 18. Input capacitances of the subsequent gates (not shown) which may be connected to the OUT node are represented by capacitor 20, coupled between the OUT node and ground.

In operation, if the IN node is at a high logic state, input transistor 12 will be in a saturated mode, causing lower input transistor 16 to also saturate and upper output transistor 14 to be off; hence, the OUT node will assume a low logic state and capacitor 20 will be discharged. When the IN node switches to a low logic level, input transistor 12 will turn off causing lower output transistor 16 also to turn off. Upper output transistor 14 will be saturated, the OUT node will assume a high logic state and capacitor 20 will be charged.

In order for the OUT signal to make a low-to-high or high-to-low logic level transition, capacitor 20 must be charged or discharged, respectively. If capacitor 20 can be made to charge more rapidly, the OUT signal will switch more rapidly to a high logic level, increasing the overall operating speed of TTL gate 10. Increasing the current through the upper output transistor 14 during the low-to-high output transition can be accomplished by reducing the value of resistor 18, thereby increasing the speed of the transition. However, during circuit testing, the OUT node is shorted to ground, causing the extra current through the upper output transistor 14 to flow for extended periods of time. Resistor 18 is intended to limit the short-circuited output current to prevent damage to upper output transistor 14; however, increasing the value of resistor 18 decreases the current available to upper output transistor 14, slowing the low-to-high output transition.

FIG. 2 illustrates the TTL gate 22 of the present invention. TTL gate 22 comprises an input transistor 12, upper and lower output transistors 14 and 16, resistors 13 and 15, and current limiting resistor 18 connected substantially as described in connection with FIG. 1. The input capacitance of the subsequent gate (not shown) is represented by capacitor 20 which must be charged and discharged for the gate output to make a low-to-high and high-to-low transition, respectively. TTL gate 22 further comprises a diode 24 with its anode coupled to ground and its cathode coupled to node 26, a second diode 28 with its anode coupled to resistor 18 and its cathode coupled to node 26, an NPN transistor 30 with its base coupled to node 26 and its emitter coupled to the collector of upper output transistor 14, and a resistor 32 coupled between voltage source $V_{cc}$ and node 26. The collector of transistor 30 is connected to $V_{cc}$. The anode of diode 36 is coupled to the anode diode 28 and to resistor 18 and the cathode of diode 36 is coupled to the collector of upper output transistor 14.

In operation, second diode 28 is operable to provide current to charge first diode 24 while signal OUT is in the a stable high or low logic state. Upon output transition from a low to high logic state, transistor 30 switches on, allowing diode 24 to discharge a current through the base emitter junction of transistor 30 and into the collector of upper output transistor 14. Until diode 24 discharges, the current flowing through upper output transistor 14 and into capacitor 20 is not limited by current limiting resistor 18 as in the prior art. After diode 24 has fully discharged, output current decreases to a level regulated by resistor 32, and beta multiplied by transistor 30, and by resistor 18. Thus, in the event that the output is shorted to ground (such as during testing), a very high current will flow for only a very short period of time, too short to damage upper output transistor 14. If the short-circuit continues after diode 24 has been discharged, the output current will have fallen to a safe level as regulated by resistor 18. The magnitude of the current generated by transistor 30 may be regulated by resistor 32.

After capacitor 20 has charged, the output current flowing through resistor 18 and upper output transistor 14 decreases to zero. Diode 28 then allows diode 24 to recharge.

Consequently, the present invention provides the technical advantage of increasing the overall operating speed of TTL gate 22 during the output low-to-high transition without allowing the output current to be at an unsafe magnitude for an extended period of time. Excessive current flow during testing may be limited without affecting the low-to-high transition speed.

Although the present invention has been described in detail, it should be understood that various changes, substitutions and alterations can be made herein without departing from the spirit and scope of the invention as defined by the appended claims.

What is claimed is:

1. A circuit for limiting the short circuit output current of a logic gate including at least one transistor, comprising:
    (a) a capacitive element operable to store a charge;
    (b) a resistive element operable to regulate the discharge time of said capacitive element;
    (c) switching circuitry including an NPN transistor having an emitter, base and collector;
    (d) charging circuitry, including a voltage source operable to charge said capacitive element;
    (e) wherein said emitter is coupled to the logic gate transistor, said base is coupled to said resistive element, and said collector is coupled to said voltage source;
    (f) whereby said capacitive element is enable to discharge a limited impulse current through said logic gate transistor, to provide a fast output transition while limiting current through said transistor.

2. The circuit of claim 1 wherein said capacitive element comprises a Schottky diode having an anode and cathode.

3. The circuit of claim 2 wherein said anode is coupled to ground and said cathode is coupled to said resistive element.

4. The circuit of claim 1 wherein said charging element comprises a Schottky diode having an anode and cathode.

5. The circuit of claim 4 wherein said anode is coupled to said voltage source and said cathode is coupled to said resistive element.

6. The circuit of claim 1 wherein said resistive element is a resistor coupled between said voltage source and said node.

* * * * *